(12) United States Patent
Chiu et al.

(10) Patent No.: US 10,558,093 B2
(45) Date of Patent: Feb. 11, 2020

(54) DISPLAY DEVICE

(71) Applicant: Innolux Corporation, Miao-Li County (TW)

(72) Inventors: Kuo-Hao Chiu, Miao-Li County (TW); Peng-Cheng Huang, Miao-Li County (TW); Hsia-Ching Chu, Miao-Li County (TW); Chien-Hung Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 248 days.

(21) Appl. No.: 15/657,285

(22) Filed: Jul. 24, 2017

(65) Prior Publication Data
US 2017/0322465 A1    Nov. 9, 2017

Related U.S. Application Data

(63) Continuation of application No. 14/460,656, filed on Aug. 15, 2014, now Pat. No. 9,772,527.

(30) Foreign Application Priority Data

Jun. 25, 2014  (TW) .............................. 103121905 A

(51) Int. Cl.
*G02F 1/1343* (2006.01)
*G09F 13/00* (2006.01)
(Continued)

(52) U.S. Cl.
CPC .. *G02F 1/134309* (2013.01); *G02F 1/136286* (2013.01); *G09F 13/00* (2013.01); *H01L 27/124* (2013.01); *G02F 2001/13629* (2013.01)

(58) Field of Classification Search
CPC ............... H01L 27/124; H01L 27/1255; G02F 1/136213
See application file for complete search history.

(56) References Cited

U.S. PATENT DOCUMENTS

| 8,817,004 B2 * | 8/2014 | Lu ..................... G02F 1/136209 345/102 |
| 2004/0257489 A1 * | 12/2004 | Gotoh ............... G02F 1/136209 349/44 |

(Continued)

FOREIGN PATENT DOCUMENTS

| CN | 1702530 A | 11/2005 |
| CN | 202383394 U | 8/2012 |

OTHER PUBLICATIONS

CN Office Action dated Oct. 27, 2017 in Chinese application (No. 201410291329.8).

(Continued)

*Primary Examiner* — Bradley Smith
*Assistant Examiner* — David J Goodwin
(74) *Attorney, Agent, or Firm* — McClure, Qualey & Rodack, LLP

(57) ABSTRACT

A display panel and a display device applying the same are provided. The display panel includes a first substrate, a second substrate, and a display medium disposed between the first substrate and the second substrate. The first substrate includes a first conductive layer having a first line width and a second conductive layer having a second line width smaller than the first line width. A first spacing is defined by a first sidewall of the second conductive layer and a second sidewall, located on the same side as the first sidewall, of the first conductive layer. A second spacing is defined by a third sidewall of the second conductive layer opposite to the first sidewall and a fourth sidewall, located on the same side as the third sidewall, of the first conductive layer. The first spacing is greater than the second spacing.

19 Claims, 5 Drawing Sheets

(51) Int. Cl.
  *G02F 1/1362* (2006.01)
  *H01L 27/12* (2006.01)

(56) References Cited

U.S. PATENT DOCUMENTS

| | | | |
|---|---|---|---|
| 2005/0263769 A1 | 12/2005 | Chul Ahn | |
| 2007/0012919 A1* | 1/2007 | Oh | H01L 29/458 257/59 |
| 2007/0103610 A1* | 5/2007 | Lee | G02F 1/136213 349/38 |
| 2007/0146592 A1* | 6/2007 | Kimura | B82Y 20/00 349/114 |
| 2007/0228379 A1* | 10/2007 | Hsu | H01L 27/1214 257/72 |
| 2008/0002076 A1* | 1/2008 | Yagi | G02F 1/136213 349/39 |
| 2008/0296591 A1* | 12/2008 | Lin | H01L 27/14665 257/88 |
| 2009/0278126 A1* | 11/2009 | Yang | H01L 21/76879 257/57 |
| 2010/0084654 A1* | 4/2010 | Yamazaki | H01L 27/0248 257/43 |
| 2012/0097940 A1 | 4/2012 | Kwon et al. | |
| 2013/0153941 A1* | 6/2013 | Sasaki | G09G 3/3648 257/88 |
| 2015/0102337 A1* | 4/2015 | Lou | H01L 27/124 257/43 |
| 2015/0255490 A1* | 9/2015 | Miyairi | H01L 27/1207 257/43 |
| 2015/0362811 A1* | 12/2015 | Huang | H01L 27/1225 438/104 |

OTHER PUBLICATIONS

CN Office Action dated Apr. 25, 2019 in Chinese application (No. 201810630068.6).

\* cited by examiner

DISPLAY DEVICE

This application is a continuation application of application Ser. No. 14/460,656, filed on Aug. 15, 2014, (now U.S. Pat. No. 9,772,527), which claims the benefit of Taiwan application Serial No. 103121905, filed Jun. 25, 2014, the subject matter of which is incorporated herein by reference.

BACKGROUND OF THE INVENTION

Field of the Invention

The present disclosure relates in general to a display panel and a display device applying the same, and more particularly to a display panel having multiple layers of conductive lines on a substrate and a display device applying the same.

Description of the Related Art

Along with the rapid advance in large-sized flat panel displays, the improvements of the manufacturing processes of TFT substrates are in rapid process as well. Since copper manufacturing processes are provided with low resistance, which is about 60% of that of aluminum, parasite capacitance between metal lines is reduced due to a smaller cross-sectional area provided by copper manufacturing processes, such that crosstalk is reduced. Moreover, high impedance and high heat-resistance of copper provide a relatively higher reliability while a relatively smaller cross-sectional area of copper is provided. Therefore, copper manufacturing processes are gradually replacing aluminum manufacturing processes and becoming the main stream in the market.

However, poor adhesion between copper and substrates causing delamination is still an issue waiting to be solved. Therefore, how to provide a display device with excellent display qualities with difficulties and issues occurring in the manufacturing processes thereof conquered is still one of the topics that people in the industry are still working on.

SUMMARY OF THE INVENTION

The present disclosure is directed to a display panel and a display device applying the same. According to the embodiments, in the substrate of the display panel, the second conductive layer is disposed on the first conductive layer and exposes a portion of the first conductive layer from two sides of the second conductive layer, and two sidewalls of the first conductive layer and two sidewalls of the second conductive layer form two spacing, wherein one of the two spacing is larger than the other. Accordingly, the breakage or damage of the two conductive layers due to over-etching can be avoided, and issues of impedance mismatching can be further reduced.

According to an embodiment of the present disclosure, a display panel is provided. The display panel includes a first substrate, a second substrate, and a display medium disposed between the first substrate and the second substrate. The first substrate includes a first conductive layer having a first line width and a second conductive layer having a second line width smaller than the first line width. The second conductive layer is disposed on the first conductive layer and exposes a portion of the first conductive layer from two sides of the second conductive layer. A first spacing is defined by a first sidewall of the second conductive layer and a second sidewall, located on the same side as the first sidewall, of the first conductive layer. A second spacing is defined by a third sidewall of the second conductive layer opposite to the first sidewall and a fourth sidewall, located on the same side as the third sidewall, of the first conductive layer. The first spacing is larger than the second spacing.

According to another embodiment of the present disclosure, a display device is provided. The display device includes a display panel and a driving circuit electrically connected to the display panel. The display panel includes a first substrate, a second substrate, and a display medium disposed between the first substrate and the second substrate. The first substrate includes a first conductive layer having a first line width and a second conductive layer having a second line width smaller than the first line width. The second conductive layer is disposed on the first conductive layer and exposes a portion of the first conductive layer from two sides of the second conductive layer. A first spacing is defined by a first sidewall of the second conductive layer and a second sidewall, located on the same side as the first sidewall, of the first conductive layer. A second spacing is defined by a third sidewall of the second conductive layer opposite to the first sidewall and a fourth sidewall, located on the same side as the third sidewall, of the first conductive layer. The first spacing is larger than the second spacing.

The above and other aspects of the invention will become better understood with regard to the following detailed description of the preferred but non-limiting embodiment (s). The following description is made with reference to the accompanying drawings.

DETAILED DESCRIPTION OF THE INVENTION

Figure 1A:
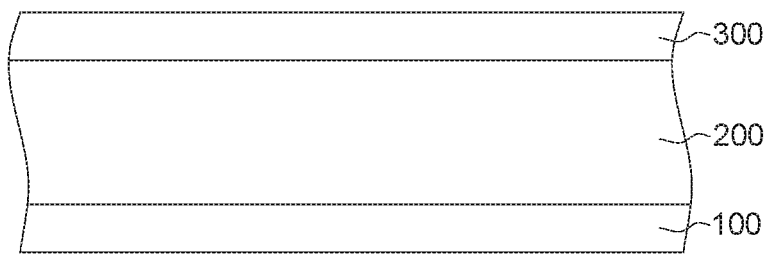
FIG. 1A shows a display panel according to an embodiment of the present disclosure.

According to the embodiments of the present disclosure, in the substrate of the display panel, the second conductive layer is disposed on the first conductive layer and exposes a portion of the first conductive layer from two sides of the second conductive layer, and two sidewalls of the first conductive layer and two sidewalls of the second conductive layer form two spacing, wherein one of the two spacing is larger than the other. Accordingly, the breakage or damage of the two conductive layers due to over-etching can be avoided, and issues of impedance mismatching can be further reduced. A number of embodiments are disclosed below with reference to accompanying drawings. The elements in the drawings sharing the same labeling are the same elements or similar elements. It should be noted that the drawings are simplified so as to provide clear descriptions of the embodiments of the present disclosure, and the descriptions of the embodiments are for description purpose only, not for limiting the scope of protection of the present disclosure. Anyone who is skilled in the technology field of the present disclosure can made necessary modifications or variations to the structures of the disclosure to meet the needs of actual implementations.

Figure 1B:
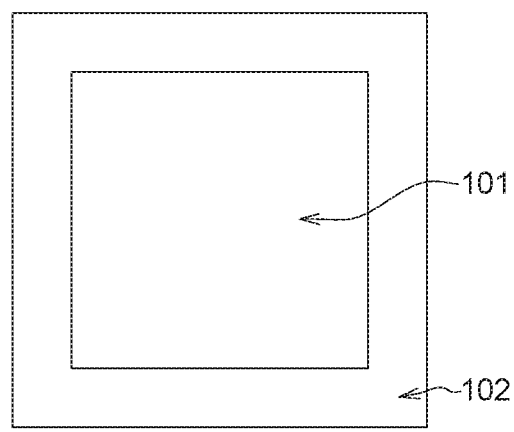
FIG. 1B shows a top view of a first substrate according to an embodiment of the present disclosure.
Figure 2A:
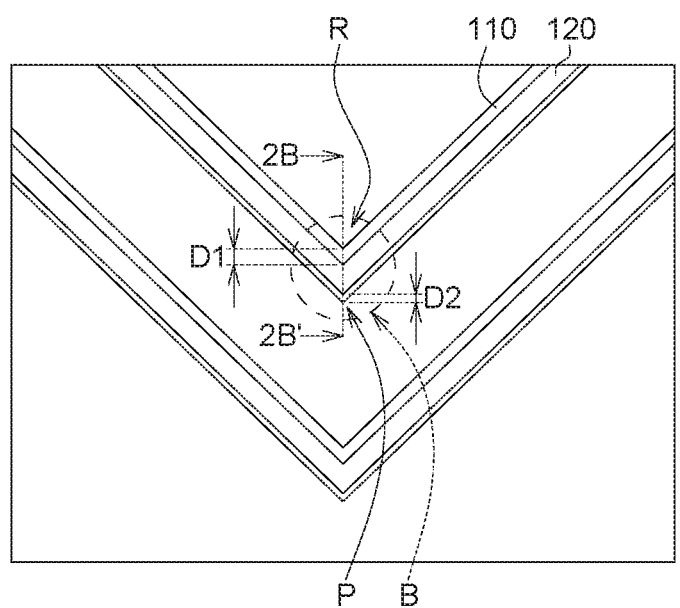
FIG. 2A shows an enlarged top view of a local area of a first substrate according to an embodiment of the present disclosure.
Figure 2B:
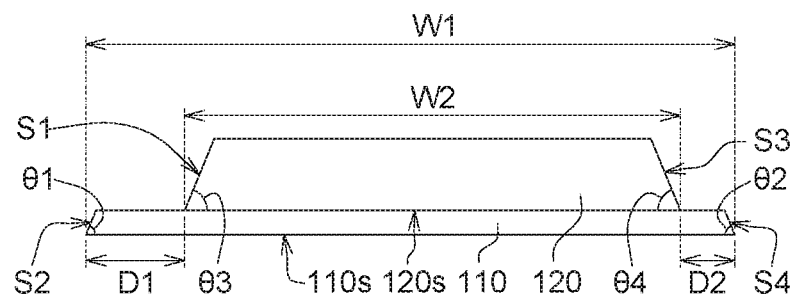
FIG. 2B shows a cross-sectional view along the cross-sectional line 2B-2B'.

FIG. 1A shows a display panel 10 according to an embodiment of the present disclosure, FIG. 1B shows a top view of a first substrate 100 according to an embodiment of the present disclosure, FIG. 2A shows an enlarged top view of a local area of the first substrate according to an embodiment of the present disclosure, and FIG. 2B shows a cross-sectional view along the cross-sectional line 2B-2B'.

As shown in FIG. 1A, the display panel 10 includes the first substrate 100, a display medium 200, and a second substrate 300. The display medium 200 is disposed between the first substrate 100 and the second substrate 300. In the embodiment, the display medium 200 is such as a liquid crystal layer or a light emitting element, for example, an organic light emitting diode. As such, the display panel 10 is such as a liquid crystal display panel or an organic light emitting diode display panel. As shown in FIG. 1B, the first substrate 100 includes a display region 101 and a display driving circuit region 102 surrounding the display region 101.

As shown in FIGS. 2A-2B, the first substrate 100 includes a first conductive layer 110 and a second conductive layer 120 disposed on the first conductive layer 110. The first conductive layer 110 has a first line width W1, and the second conductive layer 120 has a second line width W2 smaller than the first line width W1. A portion of the first conductive layer 110 is exposed from two sides of the second conductive layer 120. A first spacing D1 is defined by a first sidewall S1 of the second conductive layer 120 and a second sidewall S2, located on the same side as the first sidewall S1, of the first conductive layer 110. A second spacing D2 is defined by a third sidewall S3 of the second conductive layer 120 opposite to the first sidewall S1 and a fourth sidewall S4, located on the same side as the third sidewall S3, of the first conductive layer 110. The first spacing D1 is larger than the second spacing D2.

As shown in FIG. 2B, in the present embodiment, the first conductive layer 110 and the second conductive layer 120 are stacked together and in direct contact with each other for forming a conductive circuit having composite layers. In on embodiment, the conductive circuit is such as data lines or scan lines on the TFT substrate. In the embodiment, the first conductive layer 110 and the second conductive layer 120 are located, for example, in the gate driving circuit or the data driving circuit of the display driving circuit region 102. In another embodiment, the first conductive layer 110 and the second conductive layer 120 are located in such as the display region 101.

As shown in FIG. 2A, the conductive circuit formed from stacking the first conductive layer 110 and the second conductive layer 120 has a bending portion B, wherein the first spacing D1 is located in a recess region R of the bending portion B of the conductive circuit, and the second spacing D2 is located in a protruding region P of the bending portion B of the conductive circuit.

In the embodiment, the material of the first conductive layer 110 and the material of the second conductive layer 120 may independently comprise a metal layer of copper, titanium or the like, or a composite metal layer thereof. In the present embodiment, the material of the first conductive material 110 is such as titanium, and the material of the second conductive layer 120 is such as copper.

Figure 3A:
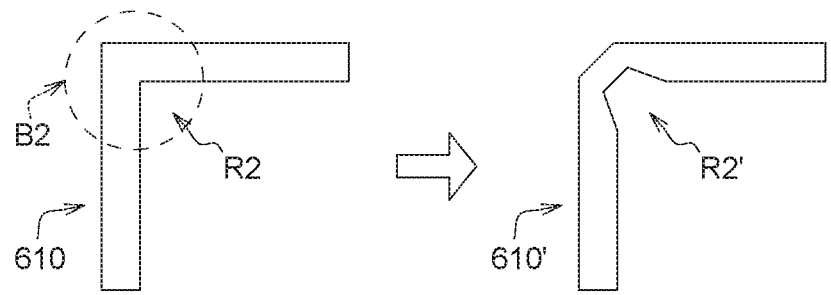
FIGS. 3A-3B show schematic diagrams of conductive layers with different shapes before and after an etching process, respectively.
Figure 3B:
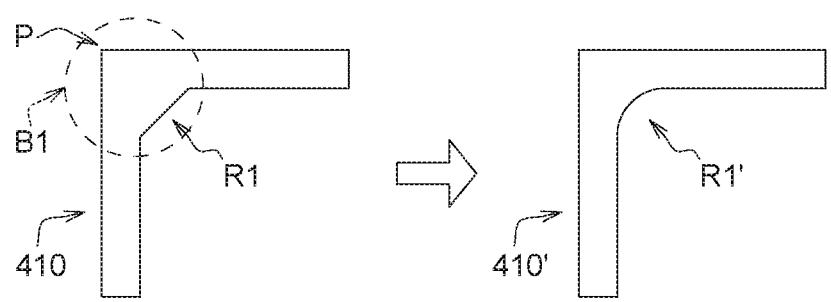

FIGS. 3A-3B show schematic diagrams of conductive layers with different shapes before and after an etching process, respectively. The conductive layer 410 is over-etched to form the conductive layer 410', and the conductive layer 610 is over-etched to form the conductive layer 610'. As shown in FIG. 3A, according to a conventional manufacturing process of forming the conductive layer 610, the design of the mask is based on the predetermined shape of the conductive layer. However, in the etching process, the etching solution may easily accumulate in the recess region R2 of the bending portion B2. While the other portion having patterns of such as a straight line has to be completely etched for forming the conductive layer having the predetermined shape, the accumulated etching solution in the recess region R2 may easily cause an over-etching situation of the bending portion B2 of the conductive layer 610, such that breakage or damage of the conductive layer 610 may occur due to the over-etching situation, resulting in the conductive layer 610' and the damaged recess region R2'. In such case, impendence mismatching may further occur easily. In contrast, as shown in FIG. 3B, in the present embodiment, the recess region R1 of the bending portion B1 of the conductive layer 410 is designed to have a relatively larger area while designing the mask, such that even if over-etching does occur to the bending portion B1 of the conductive layer 410 due to the accumulated etching solution in the recess region R1, the larger area of the recess region R1 of the bending portion B1 according to the present embodiment can avoid the above-mentioned over-etching issues; accordingly, the as-formed conductive layer 410 has a recess region R1' having a pattern very close to the predetermined shape.

Accordingly, as shown in FIGS. 2A and 2B, the conductive circuit is formed from contacting and stacking the first conductive layer 110 and the second conductive layer 120 together, wherein the first conductive layer 110 is made of such as titanium, and the second conductive layer 120 is made of such as copper. Since the first conductive layer 110 and the second conductive layer 120 are made from different metal materials, the difference in etching rates of the etching solution with respect to different metals, e.g. the etching rate of the first conductive layer is higher than the etching rate of the second conductive layer, would result in the structure as shown in FIGS. 2A and 2B, wherein the second line width W2 is smaller than the first line width W1 and a portion of the first conductive layer 110 is exposed from two sides of the second conductive layer 120. In addition, according to the description of the aforementioned FIGS. 3A and 3B, the etching solution may easily accumulate in the recess region R of the bending portion B as shown in FIGS. 2A-2B, such that the first conductive layer 110 at the recess region R may be more easily over-etched than the first conductive layer 110 at the protruding region P, resulting in the first spacing D1 located in the recess region R of the bending portion B larger than the second spacing D2 located in the protruding region P. Additionally, an angle θ1 between a bottom surface and a side of the first conductive layer located in the recess region R of the bending portion B is larger than an angle θ2 between a bottom surface and a side of the first conductive layer located in the protruding region P, and an angle θ3 between a bottom surface and a side of the second conductive layer located in the recess region R of the bending portion B is larger than an angle θ4 between a bottom surface and a side of the second conductive layer located in the protruding region P.

In the embodiment, the first spacing D1 is such as 1.1-3 times of the second spacing D2.

For example, in an embodiment, the second line width W2 of the second conductive layer 120 is such as 4.34 μm, the first spacing D1 is such as 0.68 μm, the second spacing D2 is such as 0.39 μm, and the first spacing D1 is 1.74 times of the second spacing D2. In another embodiment, the second line width W2 of the second conductive layer 120 is such as 8.89 μm, the first spacing D1 is such as 1.25 μm, the second spacing D2 is such as 0.87 μm, and the first spacing D1 is 1.44 times of the second spacing D2.

In the embodiment, the first spacing D1 is such as 10-20% of the second line width W2 of the second conductive layer 120, such as 10%, for example, 9.95-11.07%. The second spacing D2 is such as 1-10% of the second line width W2 of the second conductive layer 120, such as 6%, for example, 6.35-6.92%.

In the embodiment, as shown in FIG. 2B, the second sidewall S2 of the first conductive layer 110 and a bottom surface 110s of the first conductive layer 110 form a first angel θ1, the fourth sidewall S4 of the first conductive layer 110 and the bottom surface 110s of the first conductive layer 110 form a second angle θ2, and the first angle θ1 is such as 1.1-2 times of the second angle θ2.

For example, in an embodiment, the first angle θ1 is such as 15.00°, the second angle θ2 is such as 11.8°, and the first angle θ1 is 1.27 times of the second angle θ2. In another embodiment, the first angle θ1 is such as 57.26°, the second angle θ2 is such as 30.14°, and the first angle θ1 is 1.90 times of the second angle θ2.

Moreover, in the embodiment, as shown in FIG. 2B, the first sidewall S1 of the second conductive layer 120 and a bottom surface 120s of the second conductive layer 120 form a third angel θ3, the third sidewall S3 of the second conductive layer 120 and the bottom surface 120s of the second conductive layer 120 form a fourth angle θ4, and the third angle θ3 is such as 1.1-2 times of the fourth angle θ4.

For example, in an embodiment, the third angle θ3 is such as 65.91°, the fourth angle θ4 is such as 59.24°, and the third angle θ3 is 1.11 times of the fourth angle θ4. In another embodiment, the third angle θ3 is such as 41.19°, the fourth angle θ4 is such as 23.87°, and the third angle θ3 is 1.73 times of the fourth angle θ4.

In the embodiments, the breakage or damage of the first conductive layer 110/the second conductive layer 120 can be avoided by making the recess region of the bending portion of the conductive circuit have a relatively large area by the design of the mask, and the impedance mismatching problems can be further prevented from happening. In addition, the etching rates of the first conductive layer and the second conductive layer are different, such that the first spacing D1 would be larger than the second spacing D2, structurally. Moreover, the first angle θ1 from the first conductive layer located in the recess region R of the bending portion B is larger than the second angle θ2 rom the first conductive layer located in the protruding region P, and the third angle θ3 from the second conductive layer located in the recess region R of the bending portion B is larger than the fourth angle θ4 rom the second conductive layer located in the protruding region P.

Figure 4A:
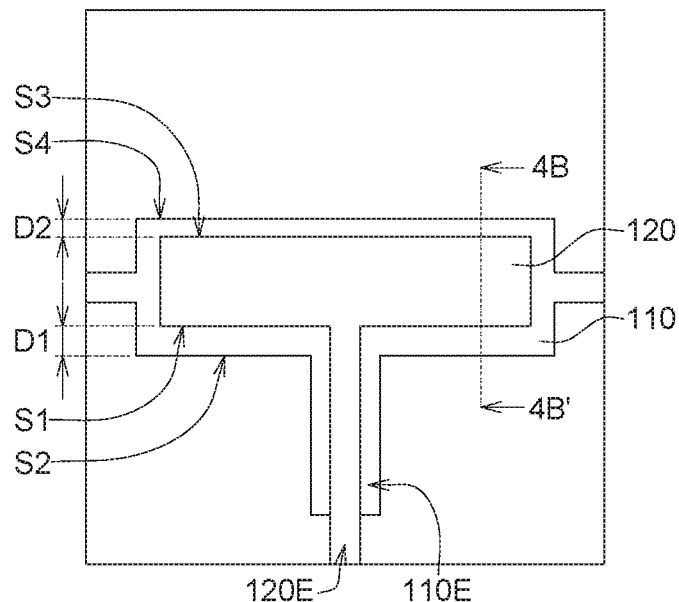
FIG. 4A shows an enlarged top view of a local area of a substrate according to another embodiment of the present disclosure.
Figure 4B:
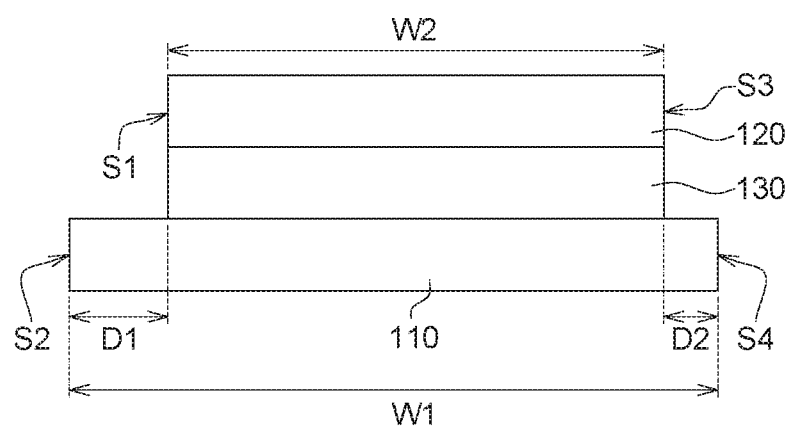
FIG. 4B shows a cross-sectional view along the cross-sectional line 4B-4B'.

FIG. 4A shows an enlarged top view of a local area of a substrate according to another embodiment of the present disclosure, and FIG. 4B shows a cross-sectional view along the cross-sectional line 4B-4B'. The substrate 100' as shown in FIGS. 4A-4B can be used as the first substrate 100 of the display panel 10. The elements in the present embodiment and previous embodiments sharing the same labeling are the same elements, and the description of which are as aforementioned.

As shown in FIGS. 4A-4B, the first substrate 100' includes a first conductive layer 110 and a second conductive layer 120 disposed on the first conductive layer 110. The first conductive layer 110 has a first line width W1, and the second conductive layer 120 has a second line width W2 smaller than the first line width W1. A portion of the first conductive layer 110 is exposed from two sides of the second conductive layer 120. A first spacing D1 is defined by a first sidewall S1 of the second conductive layer 120 and a second sidewall S2, located on the same side as the first sidewall S1, of the first conductive layer 110. A second spacing D2 is defined by a third sidewall S3 of the second conductive layer 120 opposite to the first sidewall S1 and a fourth sidewall S4, located on the same side as the third sidewall S3, of the first conductive layer 110. The first spacing D1 is larger than the second spacing D2.

In the embodiment, the first spacing D1 is such as 1.1-3 times of the second spacing D2.

For example, in an embodiment, the first line width W1 of the first conductive layer 110 is such as 22.43 μm, the second line width W2 of the second conductive layer 120 is such as 19.28 μm, the first spacing D1 is such as 1.67 μm, the second spacing D2 is such as 1.48 μm, and the first spacing D1 is 1.13 times of the second spacing D2.

As shown in FIG. 4B, the first substrate 100' further includes a dielectric layer 130 located between the first conductive layer 110 and the second conductive layer 120. In an embodiment, the composite structure of the first conductive layer 110/the dielectric layer 130/the second conductive layer 120 is such as a storage capacitor on the TFT substrate.

As shown in FIG. 4A, the second conductive layer 120 has an extending portion 120E at the first sidewall S1, and the first conductive layer 110 also has an extending portion 110E at the second sidewall S2. In other words, in the present embodiment, the first conductive layer 110 and the second conductive layer 120 have T shapes.

In the embodiment, the material of the first conductive layer 110 and the material of the second conductive layer 120 may include metals of copper, titanium and etc. or the composite conductive metal layer thereof. In the present embodiment, the materials of the first conductive layer 110 and the second conductive layer 120 are the same. In the present embodiment, the material of the first conductive layer 110 and the material of the second conductive layer 120 are both copper.

Figure 5A:
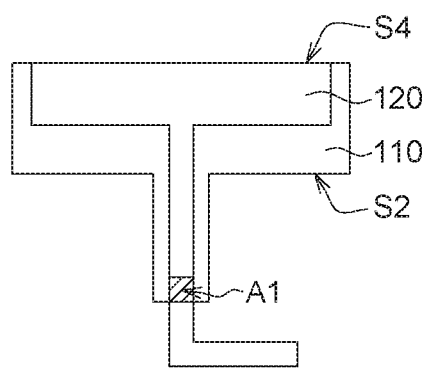
FIGS. 5A-5B show schematic diagrams of alignment shifts of conductive layers according to the embodiments of the present disclosure.
Figure 5B:
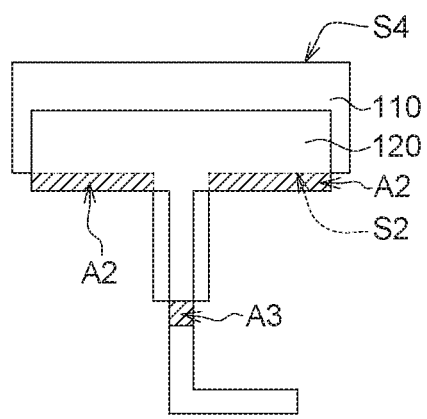

FIGS. 5A-5B show schematic diagrams of alignment shifts of conductive layers according to the embodiments of the present disclosure. FIG. 5A shows the alignment shift of the first conductive layer 110 moving toward the fourth sidewall S4 of the second conductive layer 120, and FIG. 5B shows the alignment shift of the first conductive layer 110 moving toward the second sidewall S2 of the second conductive layer 120.

In the embodiment, the composite structure of the first conductive layer 110/the dielectric layer 130/the second conductive layer 120 is used as a T-shaped storage capacitor, and the capacitance of the storage capacitor is related to the overlapped area of the first conductive layer 110 and the second conductive layer 120. Therefore, when an alignment shift occurs, the overlapped area is changed accordingly, and the capacitance of the storage capacitor is thus changed. While the overlapped area is too small, the capacitance of the storage capacitor may be insufficient, and thus, current leakage may occur, and voltage is decreased, resulting in the change of the color intensity of the display image, and the displaying effect further decays.

As shown in FIG. 5A, in the structure of the T-shaped storage capacitor, while an alignment shift of the first conductive layer 110 moving toward the fourth sidewall S4 of the second conductive layer 120 occurs, despite that the overlapped area of the first conductive layer 110 and the second conductive layer 120 is not decreased at all, on the contrary, an overlapped area A1 is increased, which causes an increase of the capacitance of the storage capacitor. On the other hand, as shown in FIG. 5B, while an alignment shift of the first conductive layer 110 moving toward to the second sidewall S2 of the second conductive layer 120, the original overlapped areas A2 and A3 do not exist anymore, which causes a decrease of the overlapped area and a decrease of the capacitance.

As such, according to the embodiments of the present disclosure, in the structure of the storage capacitor constructed by the first conductive layer 110 and the second conductive layer 120, the idea of the design is to make the first conductive layer 110 located close to the fourth sidewall S4 or away from the second sidewall S2, such that the first spacing D1 located toward the first sidewall S1 (extending portion 120E) is larger than the second spacing D2 located toward the third sidewall S3. That is, a larger buffer space for an alignment shift preserved at the direction toward the first sidewall S1 is advantageous to preventing the decrease of capacitance of the storage capacitor due to the reduced overlapped area of the first conductive layer 110 and the second conductive layer 120 caused by an alignment shift of the mask in the manufacturing process. As such, despite that an alignment shift of the first conductive layer 110 and the second conductive layer 120 may occur in the manufacturing process, such design is still helpful to maintain sufficient capacitance, and thus sufficient voltage is maintained, resulting in no decay of the display image and an improved stability of the displaying qualities.

Figure 6:
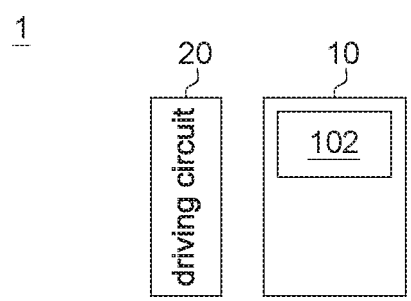
FIG. 6 shows a block diagram of a display device according to the embodiments of the present disclosure.

FIG. 6 shows a block diagram of a display device 1 according to the embodiments of the present disclosure. In a further embodiment, as shown in FIG. 6, a display device 1 is provided according to the present disclosure. The display device 1 may include the aforementioned display panel 10 and a driving circuit 20. The driving circuit 20 is electrically connected to the display panel 10 for driving the display panel 10, receiving display and control signals transmitted from outside, and transmitting the outside signals to the display driving circuit region 102 in the display panel for driving the display region 101.

The display panel and the display device applying the same of the present invention are designed in the way that the second conductive layer is located on the first conductive layer; the spacing defined by a sidewall of the first conductive layer and a sidewall of the second conductive layer located on the same side is larger than another spacing defined by an opposite sidewall of the first conductive layer and an opposite sidewall of the second conductive layer located on the same opposite side; the angle formed from a sidewall and a bottom surface of the second conductive layer and the angle formed from a sidewall and a bottom surface of the first conductive layer, which two angles are located on the same side, are larger than the angle formed from an opposite sidewall and the bottom surface of the second conductive layer and the angle formed from an opposite sidewall and the bottom surface of the first conductive layer, which two angles are located on the same side. Accordingly, the problems of impedance mismatch and decrease of capacitance causing image instability can be reduced.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
 a display panel, comprising:
  a first substrate, comprising:
   a first conductive layer having a first line width in a direction;
   a second conductive layer disposed on the first conductive layer, the second conductive layer having a second line width in the direction, and the second line width is smaller than the first line width; and
   a dielectric layer located between the first conductive layer and the second conductive layer;
   wherein a first spacing is defined by a first sidewall of the second conductive layer and a second sidewall located adjacent to the first sidewall of the first conductive layer, a second spacing is defined by a third sidewall located opposite to the first sidewall of the second conductive layer and a fourth sidewall located adjacent to the third sidewall of the first conductive layer, and the first spacing is 1.1 to 3 times of the second spacing;
  a second substrate;
  a display medium disposed between the first substrate and the second substrate; and
 a driving circuit electrically connected to the display panel.

2. The display device according to claim 1, wherein the second conductive layer exposes a portion of the first conductive layer.

3. The display device according to claim 1, wherein the first substrate comprises a display region and a display driving circuit region surrounding the display region, and the first conductive layer and the second conductive layer are located in the display driving circuit region.

4. The display device according to claim 1, wherein the second sidewall and the fourth sidewall of the first conductive layer are not overlapped with the second conductive layer.

5. The display device according to claim 1, wherein material of the first conductive layer and the material of the second conductive layer are the same.

6. The display device according to claim 1, wherein the second conductive layer has an extending portion at the first sidewall.

7. The display device according to claim 1, wherein the first spacing is about 10-20% of the second line width.

8. The display device according to claim 1, wherein the second spacing is about 1-10% of the second line width.

9. The display device according to claim 1, wherein material of the first conductive layer and material of the second conductive layer comprise copper, titanium, or a composite conductive metal layer consisting of copper and titanium.

10. The display device according to claim 1, wherein the display medium is a liquid crystal layer or a light emitting element.

11. A display device, comprising:
a display panel, comprising:
a first substrate, comprising:
a first conductive layer having a first line width in a direction;
a second conductive layer disposed on the first conductive layer, the second conductive layer having a second line width in the direction, and the second line width is smaller than the first line width; and
a dielectric layer located between the first conductive layer and the second conductive layer;
wherein a first spacing is defined by a first sidewall of the second conductive layer and a second sidewall located adjacent to the first sidewall of the first conductive layer, a second spacing is defined by a third sidewall located opposite to the first sidewall of the second conductive layer and a fourth sidewall located adjacent to the third sidewall of the first conductive layer, and
wherein the first spacing is greater than the second spacing, the first spacing is 10-20% of the second line width, and the first spacing, the second spacing and the second line width are measured along a reference line parallel to the direction;
a second substrate; and
a display medium disposed between the first substrate and the second substrate; and
a driving circuit electrically connected to the display panel.

12. The display device according to claim 11, wherein the second conductive layer exposes a portion of the first conductive layer.

13. The display device according to claim 11, wherein the first substrate comprises a display region and a display driving circuit region surrounding the display region, and the first conductive layer and the second conductive layer are located in the display driving circuit region.

14. The display device according to claim 11, wherein a material of the first conductive layer and a material of the second conductive layer are the same.

15. The display device according to claim 11, wherein a material of the first conductive layer and a material of the second conductive layer comprise copper, titanium, or a composite conductive metal layer consisting of copper and titanium.

16. A display device, comprising:
a display panel, comprising:
a first substrate, comprising:
a first conductive layer having a first line width in a direction;
a second conductive layer disposed on the first conductive layer, the second conductive layer having a second line width in the direction, and the second line width is smaller than the first line width; and
a dielectric layer located between the first conductive layer and the second conductive layer;
wherein a first spacing is defined by a first sidewall of the second conductive layer and a second sidewall located adjacent to the first sidewall of the first conductive layer, a second spacing is defined by a third sidewall located opposite to the first sidewall of the second conductive layer and a fourth sidewall located adjacent to the third sidewall of the first conductive layer, and
wherein the first spacing is greater than the second spacing, the second spacing is 1-10% of the second line width, and the first spacing, the second spacing and the second line width are measured along a reference line parallel to the direction;
a second substrate; and
a display medium disposed between the first substrate and the second substrate; and
a driving circuit electrically connected to the display panel.

17. The display device according to claim 16, wherein the second conductive layer exposes a portion of the first conductive layer.

18. The display device according to claim 16, wherein the first substrate comprises a display region and a display driving circuit region surrounding the display region, and the first conductive layer and the second conductive layer are located in the display driving circuit region.

19. The display device according to claim 16, wherein a material of the first conductive layer and a material of the second conductive layer are the same.

* * * * *